(12) United States Patent
Zhao et al.

(10) Patent No.: US 9,969,180 B2
(45) Date of Patent: May 15, 2018

(54) INKJET PRINTING METHOD, INKJET PRINTING DEVICE, AND METHOD FOR MANUFACTURING DISPLAY SUBSTRATE

(71) Applicant: BOE TECHNOLOGY GROUP CO., LTD., Beijing (CN)

(72) Inventors: Dejiang Zhao, Beijing (CN); Jie Yin, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days. days.

(21) Appl. No.: 14/770,003

(22) PCT Filed: Jan. 4, 2015

(86) PCT No.: PCT/CN2015/070025
§ 371 (c)(1),
(2) Date: Aug. 24, 2015

(87) PCT Pub. No.: WO2016/045239
PCT Pub. Date: Mar. 31, 2016

(65) Prior Publication Data
US 2016/0257138 A1 Sep. 8, 2016

(30) Foreign Application Priority Data
Sep. 24, 2014 (CN) .......................... 2014 1 0496086

(51) Int. Cl.
*H01L 51/56* (2006.01)
*H01L 27/32* (2006.01)
(Continued)

(52) U.S. Cl.
CPC .............. *B41J 11/0015* (2013.01); *B41J 2/11* (2013.01); *H01L 27/322* (2013.01);
(Continued)

(58) Field of Classification Search
CPC ...................... H01L 51/0005; H01L 21/02288
(Continued)

(56) References Cited

U.S. PATENT DOCUMENTS 6,087,196 A 7/2000 Sturm et al.
2001/0026696 A1* 10/2001 Yokota ............... G03G 15/5008
399/57
(Continued)

FOREIGN PATENT DOCUMENTS

CN 1678144 A 10/2005
CN 1700044 A 11/2005
(Continued)

OTHER PUBLICATIONS

Office Action in Chinese Patent Application No. 201410496086.1, dated Jul. 27, 2015.
(Continued)

*Primary Examiner* — Moazzam Hossain
(74) *Attorney, Agent, or Firm* — Brooks Kushman P.C.

(57) ABSTRACT

The present disclosure provides an inkjet printing device includes a first sprayer and a second sprayer; a first alignment unit configured to align the first sprayer to be above a display region of a display substrate; a second alignment unit configured to align the second sprayer to be above a peripheral region of the display substrate, the peripheral region surrounding the display region; a control unit configured to control the first sprayer to spray a solution toward the display region of the display substrate and control the second sprayer to spray a second solvent toward the peripheral region of the display substrate, the solution being obtained by dissolving a film-forming material in a first solvent; and an evaporation unit configured to evaporate the first solvent and the second solvent so as to form a film at the display region of the display substrate.

19 Claims, 4 Drawing Sheets

(51) Int. Cl.
  *B41J 11/00* (2006.01)
  *B41J 2/11* (2006.01)
  *H01L 51/00* (2006.01)
(52) U.S. Cl.
  CPC ...... *H01L 27/3244* (2013.01); *H01L 51/0005* (2013.01); *H01L 51/0007* (2013.01); *H01L 51/56* (2013.01); *H01L 2227/323* (2013.01)
(58) Field of Classification Search
  USPC ............................................. 438/23; 257/413
  See application file for complete search history.

(56) References Cited

U.S. PATENT DOCUMENTS

| | | | | |
|---|---|---|---|---|
| 2002/0041302 | A1* | 4/2002 | Okada | B41J 2/01 347/21 |
| 2004/0115339 | A1 | 6/2004 | Ito | |
| 2005/0110852 | A1* | 5/2005 | Lee | B41J 11/0015 347/97 |
| 2005/0156978 | A1* | 7/2005 | Kiguchi | B41J 2/145 347/14 |
| 2006/0008930 | A1* | 1/2006 | Toyoda | G02B 5/201 438/22 |
| 2007/0182766 | A1* | 8/2007 | Baek | G02B 5/201 347/1 |
| 2007/0215041 | A1* | 9/2007 | Kimura | B41J 3/28 118/305 |
| 2007/0252863 | A1* | 11/2007 | Sun | B41J 2/16552 347/28 |
| 2008/0024532 | A1* | 1/2008 | Kim | B41J 2/16585 347/9 |
| 2010/0201749 | A1* | 8/2010 | Somekh | B05B 17/0638 347/56 |
| 2010/0225715 | A1* | 9/2010 | Bachar | B41J 2/175 347/86 |
| 2014/0161968 | A1* | 6/2014 | Kang | B41J 2/2114 427/66 |

FOREIGN PATENT DOCUMENTS

| | | |
|---|---|---|
| CN | 1986224 A | 6/2007 |
| CN | 1994741 A | 7/2007 |
| CN | 101498856 A | 8/2009 |
| CN | 103862862 A | 6/2014 |
| CN | 104051674 A | 9/2014 |
| JP | 2005-040688 A | 2/2005 |
| JP | 2005-056614 A | 3/2005 |
| JP | 2006-061871 A | 3/2006 |
| JP | 2007-090199 A | 4/2007 |

OTHER PUBLICATIONS

International Search Report and Written Opinion in PCT International Application No. PCT/CN2015/070025, dated May 28, 2015.

* cited by examiner

INKJET PRINTING METHOD, INKJET PRINTING DEVICE, AND METHOD FOR MANUFACTURING DISPLAY SUBSTRATE

CROSS-REFERENCE TO RELATED APPLICATIONS

This application is the U.S. National Phase of PCT Application No. PCT/CN2015/070025 filed on Jan. 4, 2015, which claims a priority of the Chinese Patent Application No. 201410496086.1 filed on Sep. 24, 2014, the disclosure of which are incorporated in their entirety by reference herein.

TECHNICAL FIELD

The present disclosure relates to the field of film-forming technology, in particular to an inkjet printing method, an inkjet printing device and a method for manufacturing a display substrate.

BACKGROUND

As compared with a liquid crystal display device, an organic light-emitting diode (OLED) display device has such advantages as self luminescence, rapid response, wide viewing angle, high brightness, beautiful color, and being thin and light, so it has been regarded a next-generation display technology. As a main structure of the OLED display device, an OLED substrate includes a plurality of pixel units defined by a pixel definition layer, and each pixel unit includes an OLED for emitting rays in a specific color. When manufacturing the OLED substrate, a film-formation method for forming the OLED mainly includes an evaporation manufacture process and a solution manufacture process. The evaporation manufacture process has been widely used in a small-size display device, while the solution manufacture process mainly includes inkjet printing, nozzle coating, spinning, and screen printing. Due to a high material utilization rate and being suitable for a large-size product, the inkjet printing technique has been regarded as an important way for the mass production of the large-size OLED display device.

However, the material for the inkjet printing must be dissolved in a solvent so as to form a solution for the printing, and then the solvent in the solution is evaporated by an evaporation process so as to form a film. During the printing, the solution is sprayed through a sprayer arranged above a display region of a display substrate. FIG. 1 shows the situation of the solution when it is evaporated. For the solution, the closer to a center of the display substrate, the stronger the atmosphere formed by the solution, the closer to a saturation state, and the more difficult the evaporation of the solvent thereunder. In addition, the closer to a peripheral region, the weaker the atmosphere formed above the display substrate by the solution, and the easier the evaporation of the solvent thereunder. Because the solution is dried at the peripheral region more rapidly, it will move toward the peripheral region during the drying. As a result, an uneven film will be formed in the pixel unit after the drying, and a display effect will be adversely affected.

In order to overcome the above defects, a commonly-used method is to add a peripheral printing region AA around the peripheral region, and the solution is also sprayed onto the peripheral printing region AA during the inkjet printing. Due to the existence of the solution at the peripheral printing region AA, a saturation region will be expanded to cover the whole display region, as shown in FIG. 2. However, the peripheral printing region AA cannot be used for display, i.e., it is equivalent to that a useless region is added between the original display region and the peripheral region where leads are arranged. In this case, a width of a bezel may be increased, so it is difficult to meet the requirement of a narrow bezel in the market. Hence, there is an urgent need to find an effective way so as to prevent the occurrence of an uneven film at the display region due to different atmospheres above the display substrate during the evaporation of the solvent when the film is formed by inkjet printing.

SUMMARY

An object of the present disclosure is to provide an inkjet printing method, an inkjet printing device, and a method for manufacturing a display substrate, so as to prevent the occurrence of an uneven film at a display region due to different atmospheres above the display substrate during the evaporation of a solvent when the film is formed by inkjet printing.

In one aspect, the present disclosure provides in one embodiment an inkjet printing method, including steps of: aligning a first sprayer to be above a display region of a display substrate; aligning a second sprayer to be above a peripheral region of the display substrate, the peripheral region surrounding the display region; controlling the first sprayer to spray a solution toward the display region of the display substrate and controlling the second sprayer to spray a second solvent toward the peripheral region of the display substrate, the solution being obtained by dissolving a film-forming material in a first solvent; and evaporating the first solvent and the second solvent so as to form a film at the display region of the display substrate.

Alternatively, the first solvent is an alcohol or ester.

Alternatively, the first solvent is identical to the second solvent.

Alternatively, the first sprayer and the second sprayer are fixedly connected to each other, and aligned by an identical alignment unit.

Alternatively, the first sprayer includes a plurality of first nozzles arranged evenly on the first sprayer, and the second sprayer includes a plurality of second nozzles arranged evenly on the second sprayer.

Alternatively, the first solvent and the second solvent are evaporated by a vacuum-decompression drying process and/or a baking process.

Alternatively, the evaporated first and second solvents are collected.

Alternatively, the inkjet printing method further includes supplying the solution to the first sprayer from a solution container via a first liquid-supplying pipe, and supplying the second solvent to the second sprayed from a solvent container via a second liquid-supplying pipe.

Alternatively, the display substrate is an array substrate and/or a color filter substrate of a liquid crystal display device, or a display substrate of an OLED display device.

In another aspect, the present disclosure provides in one embodiment an inkjet printing device, including: a first sprayer and a second sprayer; a first alignment unit configured to align the first sprayer to be above a display region of a display substrate; a second alignment unit configured to align the second sprayer to be above a peripheral region of the display substrate, the peripheral region surrounding the display region; a control unit configured to control the first sprayer to spray a solution toward the display region of the display substrate and control the second sprayer to spray a second solvent toward the peripheral region of the display substrate, the solution being obtained by dissolving a film-forming material in a first solvent; and an evaporation unit configured to evaporate the first solvent and the second solvent so as to form a film at the display region of the display substrate.

Alternatively, the first sprayer and the second sprayer are fixedly connected to each other, and aligned by an identical alignment unit.

Alternatively, the first sprayer includes a plurality of first nozzles arranged evenly on the first sprayer, and the second sprayer includes a plurality of second nozzles arranged evenly on the second sprayer.

Alternatively, the inkjet printing device further includes a liquid-supplying unit for supplying the solution and the second solvent, which is in communication with the first sprayer and the second sprayer.

Alternatively, the liquid-supplying unit further includes a solution container in communication with the first sprayer via a first liquid-supplying pipe so as to supply the solution to the first sprayer, and a solvent container in communication with the second sprayer via a second liquid-supplying pipe so as to supply the second solvent to the second sprayer.

Alternatively, the inkjet printing device further includes a collection unit for collecting the evaporated first solvent and second solvent.

Alternatively, the display substrate is an array substrate and/or a color filter substrate of a liquid crystal display device, or a display substrate of an OLED display device.

In yet another aspect, the present disclosure provides in one embodiment a method for manufacturing a display substrate, including a step of forming a film at a display region of the display substrate by the above-mentioned inkjet printing method.

Alternatively, the display substrate is an array substrate and/or a color filter substrate of a liquid crystal display device, or a display substrate of an OLED display device.

According to the embodiments of the present disclosure, the solution obtained by dissolving the film-forming material in the first solvent is sprayed to the display region of the display substrate by the first sprayer, and the second solvent is sprayed to the peripheral region surrounding the display region and evaporated when the first solvent in the solution is evaporated to form a film, so the atmospheres above the display region and the peripheral region of the display substrate are substantially the same, and the solvents on the entire display substrate are evaporated at a substantially identical rate. As a result, the film with an even thickness is formed. In addition, the second solvent is evaporated, so no adverse effect is caused to the manufacture process of the display substrate. The second solvent is sprayed to the peripheral region, so the peripheral region may be an original region where leads are arranged. Moreover, because the second solvent is sprayed to the peripheral region, it is able to ensure that a size of the peripheral region is far less than that in the related art in the case of maintaining the substantially identical atmosphere above the entire display substrate. In a word, according to the inkjet printing method in the embodiments of the present disclosure, there is no additional peripheral printing region AA that cannot be used for displaying, so it is able to provide a narrow-bezel product while forming a film with an even thickness.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to a part of the embodiments of the present disclosure, and based on these drawings, a person skilled in the art may, without any creative effort, obtain the other drawings.

DETAILED DESCRIPTION

Various layers for displaying are formed on a display substrate of a display device, e.g., a hole transmission layer, an organic light-emitting layer and a resistance transmission layer are formed on an OLED display substrate. During the manufacture of the display substrate, the quality of the display device directly depends on a film-forming process for forming films to manufacture the layers.

Due to a high material utilization rate and being suitable for a large-size product, an inkjet printing technique has been regarded as an important way for the mass production of the large-size OLED display device.

However, a material for the inkjet printing must be dissolved in a solvent so as to form a solution for the printing, and then the solvent in the solution is evaporated by an evaporation process so as to form a film. During the evaporation, the film may be of an uneven thickness due to different atmospheres.

According to the embodiments of the present disclosure, a solution obtained by dissolving a film-forming material in a first solvent is sprayed to a display region of a display substrate by a first sprayer, and a second solvent is sprayed to a peripheral region surrounding the display region and evaporated when the first solvent in the solution is evaporated to form a film, so the atmospheres above the display region and the peripheral region of the display substrate are substantially the same, and the solvents on the entire display substrate are evaporated at a substantially identical rate. As a result, a film with an even thickness is formed. In addition, the second solvent is evaporated, so no adverse effect is caused to the manufacture process of the display substrate. The second solvent is sprayed to the peripheral region, so the peripheral region may be an original region where leads are arranged. Moreover, because the second solvent is sprayed to the peripheral region, it is able to ensure that a size of the peripheral region is far less than that in the related art in the case of maintaining the substantially identical atmosphere above the entire display substrate. In a word, according to an inkjet printing method in the embodiments of the present disclosure, there is no additional peripheral printing region AA that cannot be used for displaying, so it is able to provide a narrow-bezel product while forming the film with an even thickness.

The present disclosure will be described hereinafter in conjunction with the drawings and embodiments. The following embodiments are merely for illustrative purposes, but shall not be used to limit the scope of the present disclosure.

First Embodiment

Figure 3:
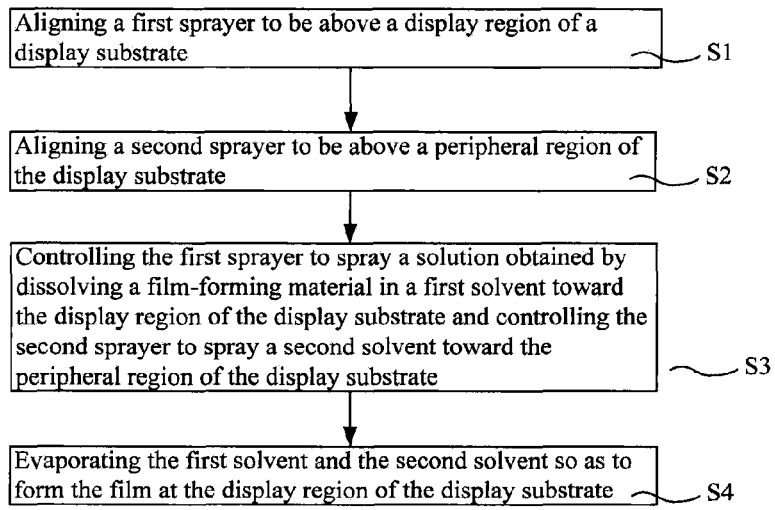
FIG. 3 is a flow chart of an inkjet printing method according to one embodiment of the present disclosure.

As shown in FIG. 3, the present disclosure provides in this embodiment an inkjet printing method for forming a film on a display region of a display substrate. The method includes steps of: Step S1: aligning a first sprayer to be above the display region of the display substrate; Step S2: aligning a second sprayer to be above a peripheral region of the display substrate, the peripheral region surrounding the display region; Step S3: controlling the first sprayer to spray a solution toward the display region of the display substrate and controlling the second sprayer to spray a second solvent toward the peripheral region of the display substrate, the solution being obtained by dissolving a film-forming material in a first solvent; and Step S4: evaporating the first solvent and the second solvent so as to form the film at the display region of the display substrate.

Figure 5:
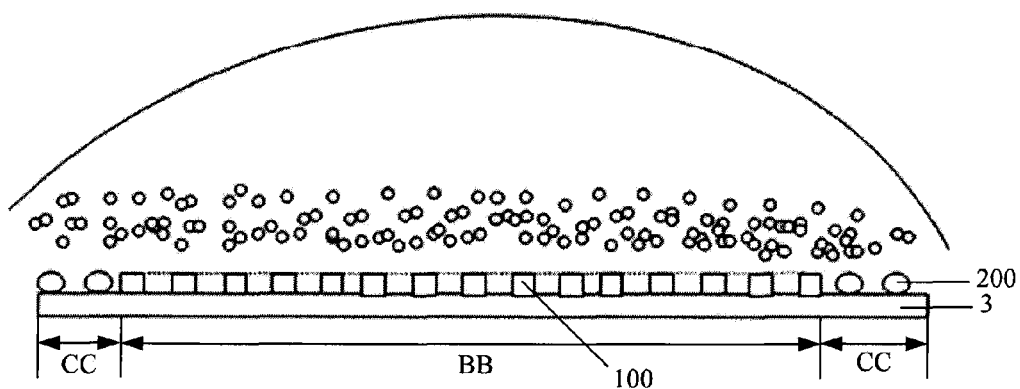
FIG. 5 is a schematic view showing a state of a solvent evaporated after a solution is sprayed to the display substrate according to one embodiment of the present disclosure.

In this embodiment, the solution desired for forming the film is sprayed to the display region of the display substrate, and the second solvent is sprayed to the peripheral region of the display substrate. When the first solvent in the solution is evaporate to form the film, the second solvent at the peripheral region is evaporated too, so as to increase an atmosphere above the peripheral region, thereby to enable the atmosphere to be substantially identical to that above the display region, as shown in FIG. 5. The first solvent and the second solvent covering the entire display substrate are evaporated at a substantially identical rate, so it is able to provide the film with an even thickness. In addition, the second solvent is evaporated, so no adverse effect is caused to the manufacture process of the display substrate.

In one embodiment, the first solvent is an organic solvent such as an alcohol or ester. The first solvent may be identical to, or different from, the second solvent. The formed film may be used to form, but not limited to, a hole transmission layer, an organic light-emitting layer and an electron transmission layer for an OLED display substrate.

Figure 4:
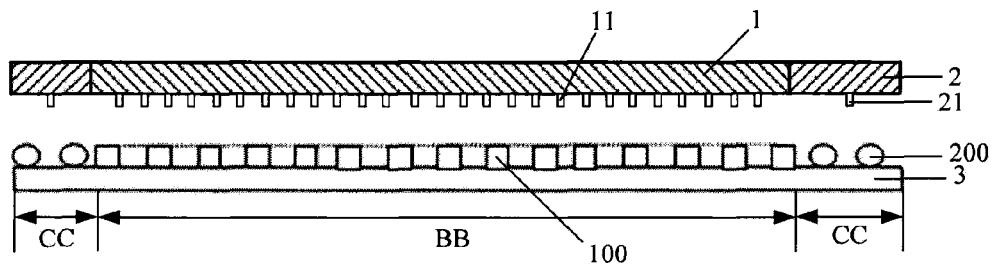
FIG. 4 is a schematic view showing the inkjet printing for the display substrate according to one embodiment of the present disclosure.

As shown in FIG. 4, in one embodiment, a nozzle 11 of the first sprayer 1 is aligned to be above the display region BB of the display substrate 3 during the inkjet printing process, so as to evenly spray the solution to the display region of the display substrate 3.

In an embodiment of the present disclosure, the first sprayer 1 includes a plurality of first nozzles 11 arranged evenly on the first sprayer 1 in a single row. The solution may be sprayed by the first sprayer 1 to the display region BB of the display substrate 3 in a scanning manner from one side of the display substrate 3 to an opposite side thereof. In one embodiment, the first sprayer 1 may also include the nozzles 11 arranged in several rows, which are also aligned to be above the display region BB of the display substrate 3.

In the embodiments of the present disclosure, the second sprayer 2 includes a plurality of second nozzles 21 arranged evenly on the second sprayer 2 in a single row. The second solvent may be sprayed by the second sprayer 21 to the peripheral region CC of the display substrate 3 in a scanning manner from one side of the display substrate 3 to an opposite side thereof. In one embodiment, the second sprayer 2 may also include the nozzles 21 arranged in several rows, which are also aligned to be above the peripheral region of the display substrate 3.

In one embodiment, the number of the plurality of first nozzles 11 in several rows may be set in such a manner as to cover the entire display region BB of the display substrate 3, and the number of the plurality of second nozzles 21 in several rows may be set in such a manner as to cover the entire peripheral region CC of the display substrate 3.

In one embodiment, the first sprayer and the second sprayer are fixedly connected to each other, and aligned by an identical alignment unit, so that the first sprayer and the second sprayer are arranged above the display region BB and the peripheral region CC of the display substrate, respectively.

After the solution and the second solvent are sprayed to the display substrate, the first solvent in the solution and the second solvent at the peripheral region CC may be evaporated by a vacuum-decompression drying process and/or a baking process.

After the first solvent in the solution and the second solvent at the peripheral region have been evaporated, the desired film is formed at the display region of the display substrate, and then a specific pattern may be formed by a patterning process.

Subsequent to the evaporation process, the evaporated first and second solvents may be collected. When the first solvent is identical to the second solvent, they may be directly reused, so as to dissolve the film-forming material, thereby to form the solution for manufacturing the film. When the first solvent is different from the second solvent, they may be reused by a separation process.

The inkjet printing method will be described hereinafter by taking an example where a film for manufacturing a pattern of a display layer of the OLED display substrate is formed.

The method includes steps of

Step a: placing the display substrate, which includes the display region and the peripheral region surrounding the display region, onto a table of an inkjet printing device;

Step b: supplying the solution to the first sprayer from a solution container via a first liquid-supplying pipe, and supplying the second solvent to the second sprayer from a solvent container via a second liquid-supplying pipe, the solvent being obtained by dissolving the film-forming material in the first solvent;

Step c: aligning the first sprayer to be above the display region of the display substrate, and aligning the second sprayer to be above the peripheral region of the display substrate;

Step d: controlling the first sprayer to spray the solution to the display region of the display substrate, and controlling the second sprayer to spray the second solvent to the peripheral region of the display substrate;

Step e: evaporating the first solvent and the second solvent, so as to form the film at the display region of the display substrate; and Step f: collecting the evaporated first solvent and second solvent.

Figure 1:
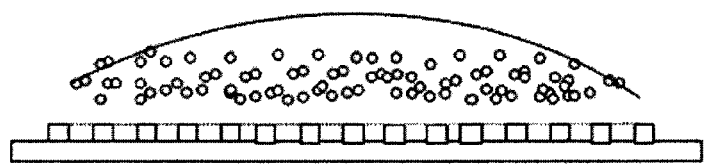
FIG. 1 is a schematic view showing a state of a solvent evaporated after a solution is sprayed to a display substrate in the related art.
Figure 2:
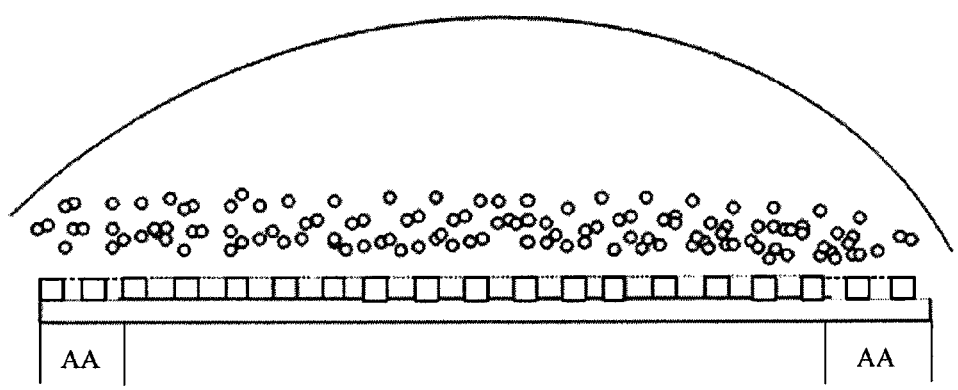
FIG. 2 is another schematic view showing a state of the solvent evaporated after the solution is sprayed to the display substrate in the related art.

By comparing FIG. 1 with FIG. 5, it can be seen that, according to the inkjet printing method in the embodiments of the present disclosure, the atmospheres above the entire display substrate are substantially the same during the evaporation process for forming the film, and the solvents are evaporated at a substantially identical rate, so it is able to ensure the formation of the film with an even thickness. By comparing FIG. 2 with FIG. 5, the second solvent is sprayed to the peripheral region CC, so the peripheral region CC may be an original region where the leads are arranged. In addition, because the second solvent is sprayed to the peripheral region CC, it is able to ensure that a size of the peripheral region CC is far less than the peripheral printing region AA in the related art in the case of maintaining the substantially identical atmosphere above the entire display substrate. In a word, according to the inkjet printing method in the embodiments of the present disclosure, there is no additional peripheral printing region AA, so it is able to provide a narrow-bezel product while forming a film with an even thickness.

Second Embodiment

The present disclosure provides in this embodiment a method for manufacturing a display substrate, including a step of forming a film on the display substrate by the above-mentioned inkjet printing method.

The film formed by the above inkjet printing method is of an even thickness, so it is able to improve the quality of the display substrate. Meanwhile, the second solvent is sprayed to the peripheral region of the display substrate, so the peripheral region may be an original region where the leads are arranged. In addition, because the second solvent is sprayed to the peripheral region, it is able to ensure that a size of the peripheral region is far less than that in the related art in the case of maintaining the substantially identical atmosphere above the entire display substrate. In a word, when forming the film for the display substrate by the above inkjet printing method, there is no additional peripheral printing region AA that cannot be used for displaying, so it is able to provide a narrow-bezel product while forming a film with an even thickness.

Alternatively, the display substrate may be an array substrate and/or a color filter substrate of a liquid crystal display device, or a display substrate of an OLED display device.

Third Embodiment

Based on an identical inventive concept, the present disclosure provides in this embodiment an inkjet printing device for forming a film on a display substrate.

Figure 6:
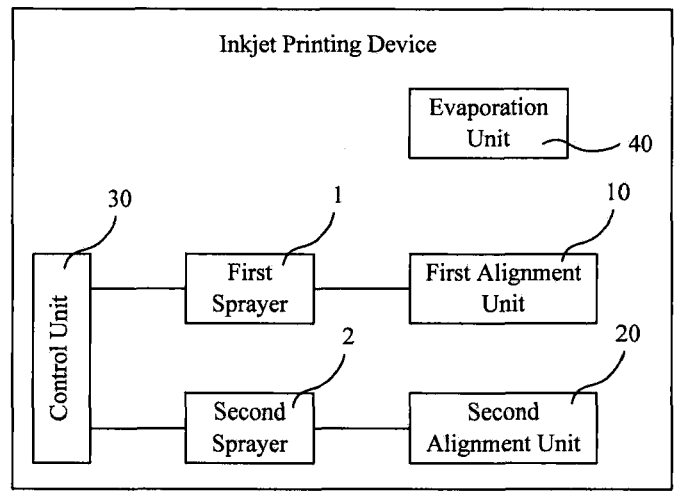
FIG. 6 is a schematic view showing an inkjet printing device according to one embodiment of the present disclosure.
Figure 7:
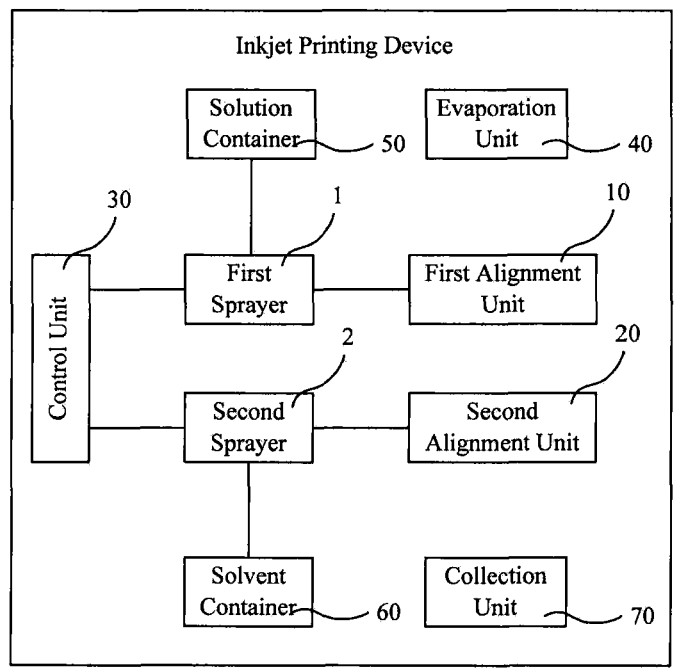
FIG. 7 is another schematic view showing the inkjet printing device according to one embodiment of the present disclosure.
Figure 8:
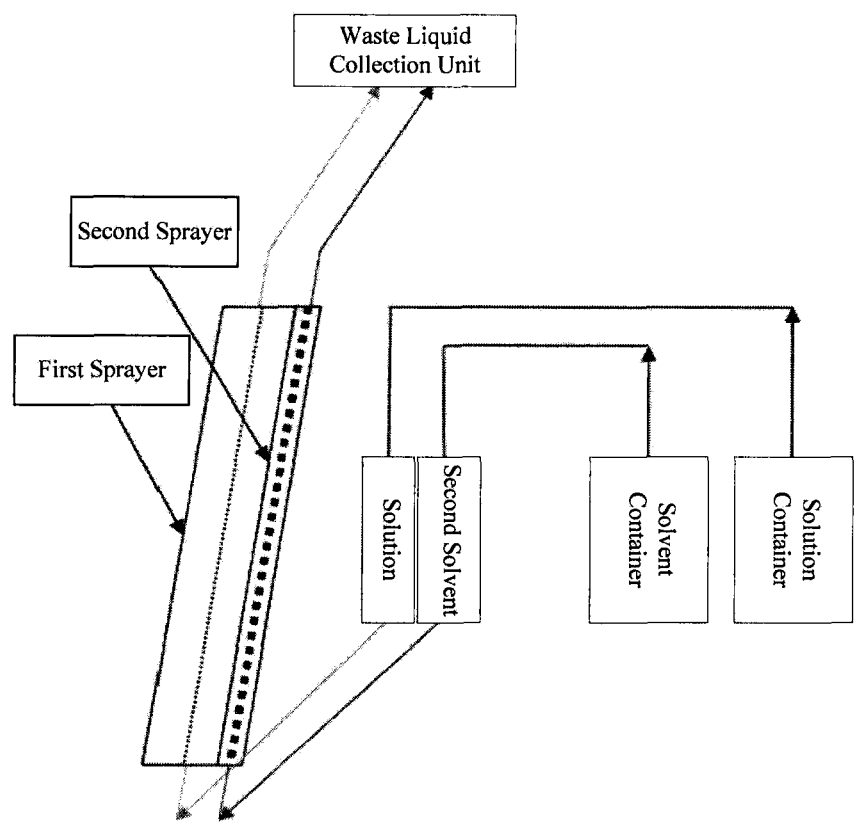
FIG. 8 is yet another schematic view showing the inkjet printing device according to one embodiment of the present disclosure.

As shown in FIGS. 4, 6 and 8, the inkjet printing device includes: the first sprayer 1 and the second sprayer 2; a first alignment unit 10 configured to align the first sprayer 1 to be above the display region BB of the display substrate 3; a second alignment unit 20 configured to align the second sprayer 2 to be above the peripheral region CC of the display substrate 3; a control unit 30 configured to control the first sprayer 1 to spray a solution toward the display region BB of the display substrate 3 and control the second sprayer 2 to spray a second solvent toward the peripheral region CC of the display substrate 33, the solution being obtained by dissolving a film-forming material in a first solvent; and an evaporation unit 40 configured to evaporate the first solvent and the second solvent so as to form a film at the display region of the display substrate.

The inkjet printing device in this embodiment includes the first sprayer and the second sprayer, the solution for forming the film is sprayed by the first sprayer to the display region of the display substrate, and the second solvent is sprayed by the second sprayer to the peripheral region of the display substrate. When the first solvent in the solution is evaporate to form the film, the second solvent at the peripheral region is evaporated too, so as to increase an atmosphere above the peripheral region, thereby to enable the atmosphere to be substantially identical to that above the display region, as shown in FIG. 5. The first solvent and the second solvent covering the entire display substrate are evaporated at a substantially identical rate, so it is able to provide the film with an even thickness. In addition, the second solvent is evaporated, so no adverse effect is caused to the manufacture process of the display substrate.

In one embodiment, the first solvent is an organic solvent such as an alcohol or ester. The first solvent may be identical to, or different from, the second solvent. The formed film may be used to form, but not limited to, a hole transmission layer, an organic light-emitting layer and an electron transmission layer for an OLED display substrate.

Alternatively, the first sprayer 1 and the second sprayer 2 may be fixedly connected to each other, and aligned by an identical alignment unit.

In an embodiment of the present disclosure, the first sprayer 1 includes a plurality of first nozzles 11 arranged evenly on the first sprayer 1 in a single row. The solution may be sprayed by the first sprayer 1 to the display region BB of the display substrate 3 in a scanning manner from one side of the display substrate 3 to an opposite side thereof. In one embodiment, the first sprayer 1 may also include the nozzles 11 arranged in several rows, which are also aligned to be above the display region BB of the display substrate 3.

In an embodiment of the present disclosure, the second sprayer 2 includes a plurality of second nozzles 21 arranged evenly on the second sprayer 2 in a single row. The second solvent may be sprayed by the second sprayer 21 to the peripheral region CC of the display substrate 3 in a scanning manner from one side of the display substrate 3 to an opposite side thereof. In one embodiment, the second sprayer 2 may also include the nozzles 21 arranged in several rows, which are also aligned to be above the peripheral region of the display substrate 3.

In one embodiment, the number of the plurality of first nozzles 11 in several rows may be set in such a manner as to cover the entire display region BB of the display substrate 3, and the number of the plurality of second nozzles 21 in several rows may be set in such a manner as to cover the entire peripheral region CC of the display substrate 3.

In one embodiment, the inkjet printing device further includes a liquid-supplying unit for supplying the solution and the second solvent which is in communication with the first sprayer and the second sprayer. The liquid-supplying unit further includes a solution container 50 in communication with the first sprayer 1 via a first liquid-supplying pipe so as to supply the solution to the first sprayer 1, and a solvent container 60 in communication with the second sprayer 2 via a second liquid-supplying pipe so as to supply the second solvent to the second sprayer 2.

In one embodiment, the inkjet printing device may further include a collection unit 70 for collecting the evaporated first solvent and second solvent for reuse. In conjunction with FIGS. 4 and 6-8, an operating procedure of the inkjet printing device will be described hereinafter by taking the film forming layers of the OLED display substrate as an example. The operating procedure includes steps of: Step a: placing the display substrate 3, which includes the display region and the peripheral region surrounding the display region, onto a table (not shown) of the inkjet printing device; Step b: supplying the solution to the first sprayer 1 from the solution container 50 via the first liquid-supplying pipe (not shown), and supplying the second solvent to the second sprayer from the solvent container 60 via the second liquid-supplying pipe (not shown), the solvent being obtained by dissolving the film-forming material in the first solvent; Step c: aligning the first nozzle 11 of the first sprayer 1 to be above the display region BB of the display substrate 3 by the first alignment unit 10, and aligning the second nozzle 21 of the second sprayer 2 to be above the peripheral region CC surrounding the display region BB by the second alignment unit 20; Step d: controlling the first sprayer 1 to spray the solution 100 to the display region BB of the display substrate 3 by the control unit 30, and controlling the second sprayer 2 to spray the second solvent 200 to the peripheral region CC of the display substrate 3 by the control unit 30; Step e: evaporating the first solvent and the second solvent by the evaporation unit 40, so as to form the film at the display region of the display substrate, the evaporation unit 40 including a vacuum-decompression drying device and/or a baking device; and Step f: collecting the evaporated first solvent and second solvent by the collection unit 70.

According to the inkjet printing device in the embodiments of the present disclosure, it is able to form the film with an even thickness at the display region of the display substrate. In addition, it is unnecessary to provide an additional peripheral printing region, so it is able to meet the requirements of a narrow-bezel product.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. An inkjet printing device, comprising:
    a first sprayer and a second sprayer, which are arranged separately, wherein both the first sprayer and the second sprayer have a strip shape, the second sprayer being arranged to abut and be parallel with the first sprayer;
    a first alignment unit configured to align the first sprayer to be above a display region of a display substrate;
    a second alignment unit configured to align the second sprayer to be above a peripheral region of the display substrate, the peripheral region surrounding the display region;
    a control unit configured to control the first sprayer to spray a solution obtained by dissolving a film-forming material in a first solvent toward the display region of the display substrate and control the second sprayer to spray a second solvent toward the peripheral region of the display substrate; and
    an evaporation unit configured to evaporate the first solvent and the second solvent so as to form a film at the display region of the display substrate.

2. The inkjet printing device according to claim 1, wherein
    the first sprayer comprises a plurality of first nozzles arranged evenly on the first sprayer, and
    the second sprayer comprises a plurality of second nozzles arranged evenly on the second sprayer.

3. The inkjet printing device according to claim 1, further comprising a liquid-supplying unit for supplying the solution and the second solvent, which is in communication with the first sprayer and the second sprayer.

4. The inkjet printing device according to claim 3, wherein the liquid-supplying unit further comprises
    a solution container in communication with the first sprayer via a first liquid-supplying pipe so as to supply the solution to the first sprayer, and
    a solvent container in communication with the second sprayer via a second liquid-supplying pipe so as to supply the second solvent to the second sprayer.

5. The inkjet printing device according to claim 1, further comprising a collection unit for collecting the evaporated first solvent and second solvent.

6. The inkjet printing device according to claim 1, wherein the display substrate is an array substrate and/or a color filter substrate of a liquid crystal display device, or a display substrate of an organic light-emitting diode (OLED) display device.

7. An inkjet printing method for an inkjet printing device comprising: a first sprayer and a second sprayer, which are arranged separately, wherein both the first sprayer and the second sprayer have a strip shape, the second sprayer is arranged to abut and be parallel with the first sprayer; a first alignment unit configured to align the first sprayer to be above a display region of a display substrate; a second alignment unit configured to align the second sprayer to be above a peripheral region of the display substrate, the peripheral region surrounding the display region; a control unit configured to control the first sprayer to spray a solution obtained by dissolving a film-forming material in a first solvent toward the display region of the display substrate and control the second sprayer to spray a second solvent toward the peripheral region of the display substrate; and an evaporation unit configured to evaporate the first solvent and the second solvent so as to form a film at the display region of the display substrate, wherein the method comprises the steps of:
    aligning the first sprayer to be above a display region of a display substrate;
    aligning the second sprayer to be above a peripheral region of the display substrate, the peripheral region surrounding the display region;
    controlling the first sprayer to spray a solution obtained by dissolving a film-forming material in a first solvent toward the display region of the display substrate and controlling the second sprayer to spray a second solvent toward the peripheral region of the display substrate; and
    evaporating the first solvent and the second solvent so as to form a film at the display region of the display substrate.

8. The inkjet printing method according to claim 7, wherein the first solvent is an alcohol or ester.

9. The inkjet printing method according to claim 7, wherein the first solvent is identical to the second solvent.

10. The inkjet printing method according to claim 7, wherein the first sprayer and the second sprayer are fixedly connected to each other, and aligned by an identical alignment unit.

11. The inkjet printing method according to claim 7, wherein
    the first sprayer comprises a plurality of first nozzles arranged evenly on the first sprayer, and
    the second sprayer comprises a plurality of second nozzles arranged evenly on the second sprayer.

12. The inkjet printing method according to claim 7, wherein the first solvent and the second solvent are evaporated by a vacuum-decompression drying process and/or a baking process.

13. The inkjet printing method according to claim 7, further comprising a step of:
    collecting the evaporated first and second solvents.

14. The inkjet printing method according to claim 7, further comprising steps of:
    supplying the solution to the first sprayer from a solution container via a first liquid-supplying pipe; and supplying the second solvent to the second sprayed from a solvent container via a second liquid-supplying pipe.

15. The inkjet printing method according to claim 7, wherein the display substrate is an array substrate and/or a color filter substrate of a liquid crystal display device, or a display substrate of an organic light-emitting diode (OLED) display device.

16. A method for manufacturing a display substrate, comprising a step of:
    forming a film at a display region of the display substrate by the inkjet printing method according to claim 7.

17. The method according to claim 16, wherein the display substrate is an array substrate and/or a color filter substrate of a liquid crystal display device, or a display substrate of an organic light-emitting diode (OLED) display device.

18. The inkjet printing method according to claim 8, wherein the first solvent is identical to the second solvent.

19. The inkjet printing method according to claim 8, wherein the first sprayer and the second sprayer are fixedly connected to each other, and aligned by an identical alignment unit.

* * * * *